United States Patent

Hsu et al.

[11] Patent Number: 6,147,910
[45] Date of Patent: Nov. 14, 2000

[54] PARALLEL READ AND VERIFY FOR FLOATING GATE MEMORY DEVICE

[75] Inventors: Yu-Ming Hsu, Hsinchu; Yin-Shang Liu, Tsao-Twen; Chun-Hsiung Hung, Hsinchu, all of Taiwan; Ray-Lin Wan, Fremont, Calif.; Y. T. Lin, Hsinchu, Taiwan

[73] Assignee: Macronix International Co., Ltd., Taiwan

[21] Appl. No.: 09/386,766

[22] Filed: Aug. 31, 1999

[51] Int. Cl.$^7$ ................................... G11C 16/06
[52] U.S. Cl. .............................. 365/185.25; 365/185.22; 365/189.05; 365/203; 365/204
[58] Field of Search ........................ 365/189.01, 185.22, 365/185.25, 189.05, 203, 204

[56] References Cited

U.S. PATENT DOCUMENTS

| | | | |
|---|---|---|---|
| 5,163,021 | 11/1992 | Mehrotha et al. | 365/185 |
| 5,638,326 | 6/1997 | Hollmer et al. | 365/185.2 |
| 5,835,414 | 11/1998 | Hung et al. | 365/185.28 |
| 5,912,844 | 6/1999 | Chen et al. | 365/185.28 |
| 5,999,451 | 12/1999 | Lin et al. | 365/185.11 |
| 6,040,993 | 3/2000 | Chen et al. | 365/185.03 |

FOREIGN PATENT DOCUMENTS

WO 96/21227  11/1996  WIPO ............................ G11C 11/40

OTHER PUBLICATIONS

Tanaka et al., "High–Speed Programming and Program–Verify Methods Suitable for Low–Voltage Flash Memories", 1994 Symposium on VLSI Circuits, Digest of Technical Papers, pp. 61–62.

Sun, et al., "A 3.3V 32 Mb NAND Flash Memory with Incremental Step Pulse Programming Scheme", 1995 IEEE International Solid–State Circuits Conference, Digest of Technical Papers, pp. 128–129, 350.

Kim et al., "A 120mm$^2$ 64Mb NAND Flash Memory Achieving 180ns/Byte Effective Program Speed", 1996 Symposium on VLSI Circuits, Digest of Technical Papers, pp. 168–169.

Kawahara, et al., "Bit–line Clamped Sensing Multiplex and Accurate High–Voltage Generator for 0.25$\mu$m Flash Memories", 1996 IEEE International Solid–State Circuits Conference, Digest of Technical Papers, pp. 38–39.

*Primary Examiner*—Viet Q. Nguyen
*Attorney, Agent, or Firm*—Beyer Weaver & Thomas LLP

[57] ABSTRACT

A page mode flash memory or floating gate memory device, including a page buffer based upon low current bit latches, and additional capabilities for parallel read and parallel program verify operations. The present device includes bit latch circuitry and/or method steps that facilitate such parallel operations and avoid data conflicts. Circuitry for separate read signals can serve to isolate the operations. Additionally, circuitry tied to the data verification signal can also be used. A diode type device can be used to isolate signal conditions that might indicate the cell does not need to be programmed. Bit-by-bit precharging of the bit lines can also be employed in order to save precharging power. Additionally, the large capacitance of the dataline might be used to delay discharging a particular dataline, and thereby allow a latch enabling signal to go high, thus eliminating the need for further isolation circuitry, or the like.

6 Claims, 9 Drawing Sheets

PARALLEL READ AND VERIFY FOR FLOATING GATE MEMORY DEVICE

This application is related to U.S. Pat. No. 5,835,414, entitled "Page Mode Program, Page Mode Verify, Read and Erase Verify for Floating Gate Memory Device with Low Current Page Buffer," which is hereby incorporated by reference.

BACKGROUND OF THE INVENTION

1. Field of the Invention

The present invention relates to integrated circuit memory devices based on floating gate transistor technology; and more particularly to parallel read and verify operations for page mode flash memory.

2. Description of Related Art

Flash memory is a growing class of non-volatile storage integrated circuits based on floating gate transistors. The memory cells in a flash device are formed using so called floating gate transistors in which the data is stored in a cell by charging or discharging the floating gate. The floating gate is a conductive material, typically polysilicon, which is insulated from the channel of the transistor by a thin layer of oxide, or other insulating material, and insulated from the control gate of the transistor by a second layer of insulating material.

To store data in a floating gate memory cell, the floating gate is charged or discharged using a Fowler-Nordheim tunneling mechanism, or hot electron injection mechanism. The Fowler-Nordheim tunneling mechanism is executed by establishing a large positive (or negative) voltage between the gate and source or drain of the device. This causes electrons to be injected into (or out of) the floating gate through the thin insulator. The hot electron injection mechanism is based on an avalanche process. Hot electron injection is induced by applying potentials to induce high-energy electrons in the channel of the cell, which are injected across the thin insulator into the floating gate. To induce hot electron injection, a potential is applied across the source and drain of the device, along with a positive potential on the control gate. The positive potential on the control gate tends to draw electrons from the current in the channel of the device into the floating gate.

The acts of charging and discharging the floating gate in a floating gate memory device are relatively slow compared to writing other memory types, like static or dynamic random access memory, and limit the speed with which data may be written into the device.

Another problem associated with floating gate memory devices arises because the charging and discharging of the floating gate memory devices arises because the charging and discharging of the floating gate is difficult to control over a large array of cells. Thus, some of the cells program or erase more quickly than others in the same device. In a given program or erase operation, not all the cells subject of the operations will settle with the same amount of charge stored in the floating gate. Thus, so called program verify and erase verify sequences have been developed to efficiently ensure that the memory is being accurately programmed and erased. The program and erase verify operations are based on comparing the data stored in the floating gate memory array with the intended data. The process of comparing data is relatively time consuming, involving sequencing byte by byte through the programmed or erased cells. If the failure is detected in the verify sequence, then the program or erase operation is retried. Program retries are typically executed word-by-word or byte-by-byte in prior art devices. Thus, bits successfully programmed in a byte with one failed bit are subject to the program cycle repeatedly. This can result in over-programming and failure of the cell.

One approach to resolving this issue is set forth in U.S. Pat. No. 5,163,021 by Mehrotra et al., at column 19, line 10, and referring to FIGS. 14–17.

To improve the efficiency of program and program verify operations, so-called page mode flash devices have been developed. In these devices, a page buffer is associated with the memory array. The page buffer includes a set of bit latches, one bit latch associated with each global bit line in the array. To program a page in the array, the page buffer is loaded with data to be programmed, by transferring byte by byte program data into the bit latches of the page buffer. The program operation is then executed in parallel on a bit line by bit line basis controlled by the contents of the bit latches. The verify procedure is based on clearing automatically all the bit latches in the page buffer which are successfully programmed in a parallel operation. The page buffer is then read byte-by-byte to confirm that all bits have been cleared, indicating a successful program operation.

The page mode program process is described for example in commonly owned prior PCT patent application entitled ADVANCED PROGRAM VERIFY FOR PAGE MODE FLASH MEMORY, filed Jan. 5, 1995, application Ser. No. PCT/US95/00077. In this application, the program verify operation relies on the sense amplifiers in the memory, which are limited in number, typically to 16, to sense the state of the memory cells being programmed. If the cell is programmed to the proper state, then the bit latch is reset based on the sense amplifier output. The sense amplifier is used because of charge sharing issues which arise from attempting to sense the level of bit lines in the memory array by a latch structure. The bit latch structure typically requires a significant current to reliably reset the latch. The sense amplifier circuit is able to provide sufficient current to reset the bit latch, while the bit line current through the memory cells is normally low due to the small geometry of the cells.

Other attempts at page mode program verify circuits been made. For example, Tanaka et al., "High Speed Programming and Program-Verify Methods Suitable for Low-Voltage Flash Memories," Symposium on VLSI circuits, Digest of Technical Papers, 1994, pgs. 62–64. The Tanaka et al. paper describes a system in which the bit latches are directly coupled to the bit lines of the array. However, in the design proposed by Tanaka et al., the bit latches directly fight the bit line voltage. Thus the bit line is required to conduct sufficient current to flip the bit latch. The design is therefore difficult to implement efficiently, and the data integrity is questionable because the bit line and latch fight for charge during the verify sequence.

Another prior art approach is described in Suh et al., "A 3.3V 32 Mb NAND Flash Memory With Incremental Step Pulse Programming Scheme," 1995 IEEE International Solid-State Circuits Conference, pg. 128–129 (Feb. 16, 1995). In Suh et al. a page buffer structure is described in which a current mirror structure is utilized to boost the drive capability of the bit lines for resetting bit latches. In Suh et al., a page buffer structure is described in which a current mirror structure is utilized to boost the driving capability of the bit lines for resetting bit latches. In Suh et al., during the verify operation, the wordlines are pumped to an increased voltage to double the cell current. A current mirror is coupled to with each bit line to fight with the cell. After waiting enough time for the bit line to discharge, a parallel reset of the latches is based on the resulting bit line voltage. The reliance on a current mirror in association with each bit latch requires extra current drive capability during the verify process, and increases the complexity of the circuit.

Neither Suh et al., nor Tanaka et al., describe the use of bit latches with processes which involve applying a high voltage to the bit lines, as required for some types of floating gate memory program or erase operations. Accordingly, Hung et al., U.S. Pat. No. 5,835,414 which is commonly owned by the Applicant, provides an improved page buffer which operates with low current bit lines, and is capable of supporting program, program verify, read and erase verify processes during a page mode operation. U.S. Pat. No. 5,835,414 is hereby incorporated by reference.

Another important feature to enhance the speed of such floating gate memory devices is the use of parallel bit operations. Traditionally, memory devices use sense amplifiers and connecting reference cells configured to read and verify the state of one byte of memory cells at a time. Consequently, the read and verify operations take a great deal of time to complete for a large number of memory cells in an array. To enhance access speed, sense amplifier outputs may be provided to a page buffer. To enhance speed further, more than a byte of memory cells can be read or verified in parallel by the sense amplifiers. Hollmer et al., U.S. Pat. No. 5,638,326, enables a page buffer to latch the values stored in more than a byte of memory cells in parallel without first using separate sense amplifier circuitry, while ensuring the values latched are accurate irrespective of temperature, Vcc, and process variations. As configured, each page buffer latch provides the dual function of a sense amplifier and data storage element. Such dual functionality can carry certain drawbacks including, for instance, a more complicated circuit that may sacrifice individual task efficiency for the sake of providing dual functions.

Still another prior art approach is described in Kawanara et al., "Bit-Line Clamped Sensing Multiplex and Accurate High-Voltage Generator for 0.25 um Flash Memories," ISSCC Digest of Technical Papers, pgs. 38–39, Feb. 8, 1996. A flash memory cell is described wherein each sector is programmed simultaneously by a latch circuit used for each bit-line. An associated multiplexing amplifier is then required to provide an intermittent burst transfer for each sector read. While this design uses a separate sense amplifier circuit, it should be noted that the load on the circuit might become too heavy if the phase difference between signals is too great.

Bit-by-bit precharging during the program verify operation is also desired in order to save precharge power. The prior art example of Kim et al, "A 120 mm 64 Mb NAND Flash Memory Achieving 180 ns/Byte Effective Program Speed," Symposium on VLSI Circuits, Digest of Technical Papers, pgs. 168–169, 1996, discloses a technique for full-chip burst read. During random access the bit lines are precharged. Charge sharing is also employed between the sensing node and the bit-line, wherein improved access time is achieved by using this precharging and charge sharing technique with a staggered row decoder.

What is needed in the field is an improved page buffer that operates with low current bit lines, and is capable of supporting parallel read and verify processes in a page mode. Furthermore, it is desirable that a bit-by-bit precharge be provided for program and verify operations, and that various data nodes can be isolated to avoid data conflicts.

SUMMARY OF THE INVENTION

The present invention provides an improved page buffer that operates with low current bit lines, and is capable of supporting parallel read and program verify processes in a page mode. Additionally, the present invention provides a bit-by-bit precharge capability in order to conserve precharge power. Circuitry is also provided which isolates data nodes to avoid data conflicts during parallel operations.

In order to perform a parallel page read operation, the steps would include, but are not limited to, the following: 1) Setting all the bit latches through a bit latch enable signal. 2) Charging up all the bit lines to certain voltage, for instance 2 volts. 3) Discharging the bit line to zero if the cell corresponds to a low voltage threshold, and not discharging the bit line if the cell corresponds to a high voltage threshold. 4) Reading the data via setting the read signal to high. If the bit line is low, then the bit latch data will be set to high, and if the bit line is high, then the bit latch data will remain low. This will latch the whole page of data through the bit latch. 5) Locking the latch by setting the read signal to low.

A parallel program verify operation would include, but is not limited to, the following steps: 1) Loading the programming data to the bit latch. This involves setting the bit latch data to high for a cell to be programmed, and setting the bit latch data to low for a cell not to be programmed. 2) Discharging all of the bit lines. 3) Charging up the bit line if the bit latch data signal is set high, and not charging up the bit line if the bit latch data signal is set low. 4) Discharging the bit line if the cell corresponds to a low voltage threshold, and not discharging the bit line if the cell corresponds to a high voltage threshold. 5) Setting a verify signal to high. If the bit line is set to low, then the bit latch data signal will be set to low. If the bit line is high, then the bit latch data signal will remain at it's original value. 6) Locking the latch by setting the verify signal to low.

An apparatus according to the present invention includes bit latch circuitry to provide at least one read signal configured to isolate the latch data signal from the dataline. Circuitry is also provided to allow for bit-by-bit precharging of the bit lines, in order to save precharge power. Data isolation circuitry is also provided to avoid data conflicts during parallel read and parallel program verify methods.

These and other advantages of the present invention will become apparent upon reading the following detailed descriptions and studying the various figures of the drawings.

DETAILED DESCRIPTION OF THE PREFERRED EMBODIMENTS

Figure 4:
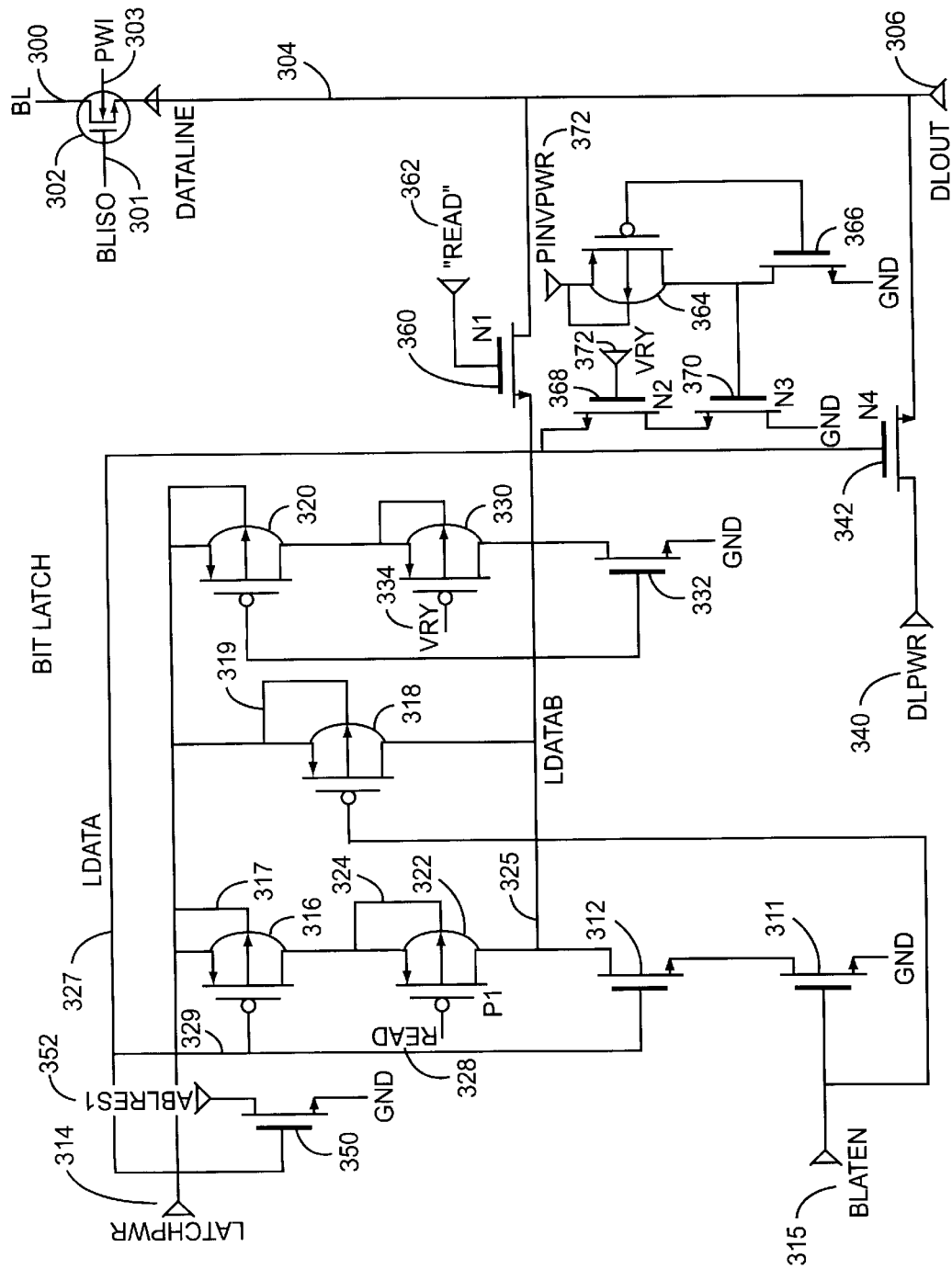
FIG. 4 is a circuit diagram of a bit latch, for use with the bit latch structure of FIG. 3, for achieving parallel read and verify operations according to the present invention.
Figure 5:
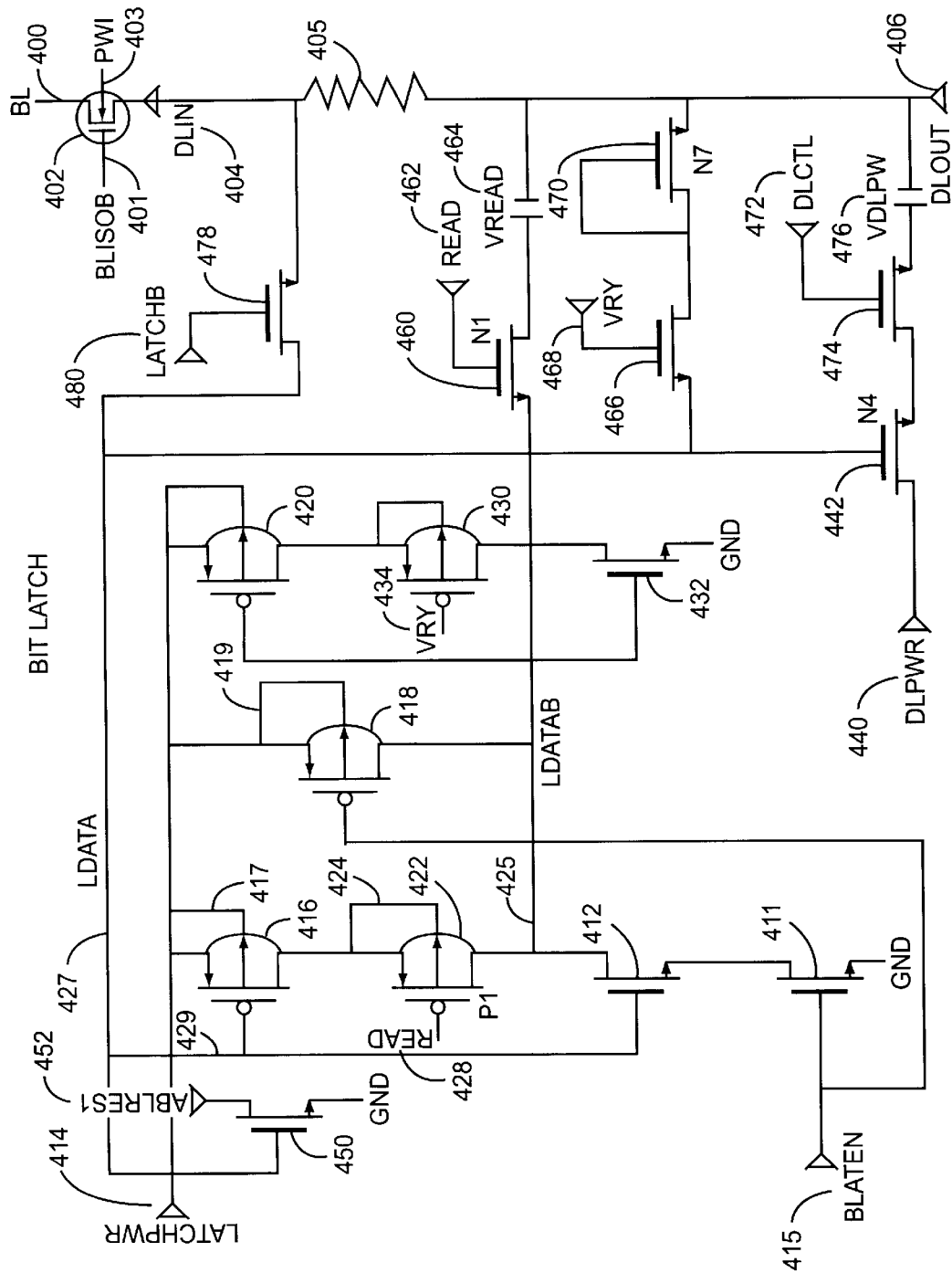
FIG. 5 is another circuit diagram of a bit latch, for use with the bit latch structure of FIG. 3, for achieving parallel read and verify operations according to the present invention.
Figure 6:
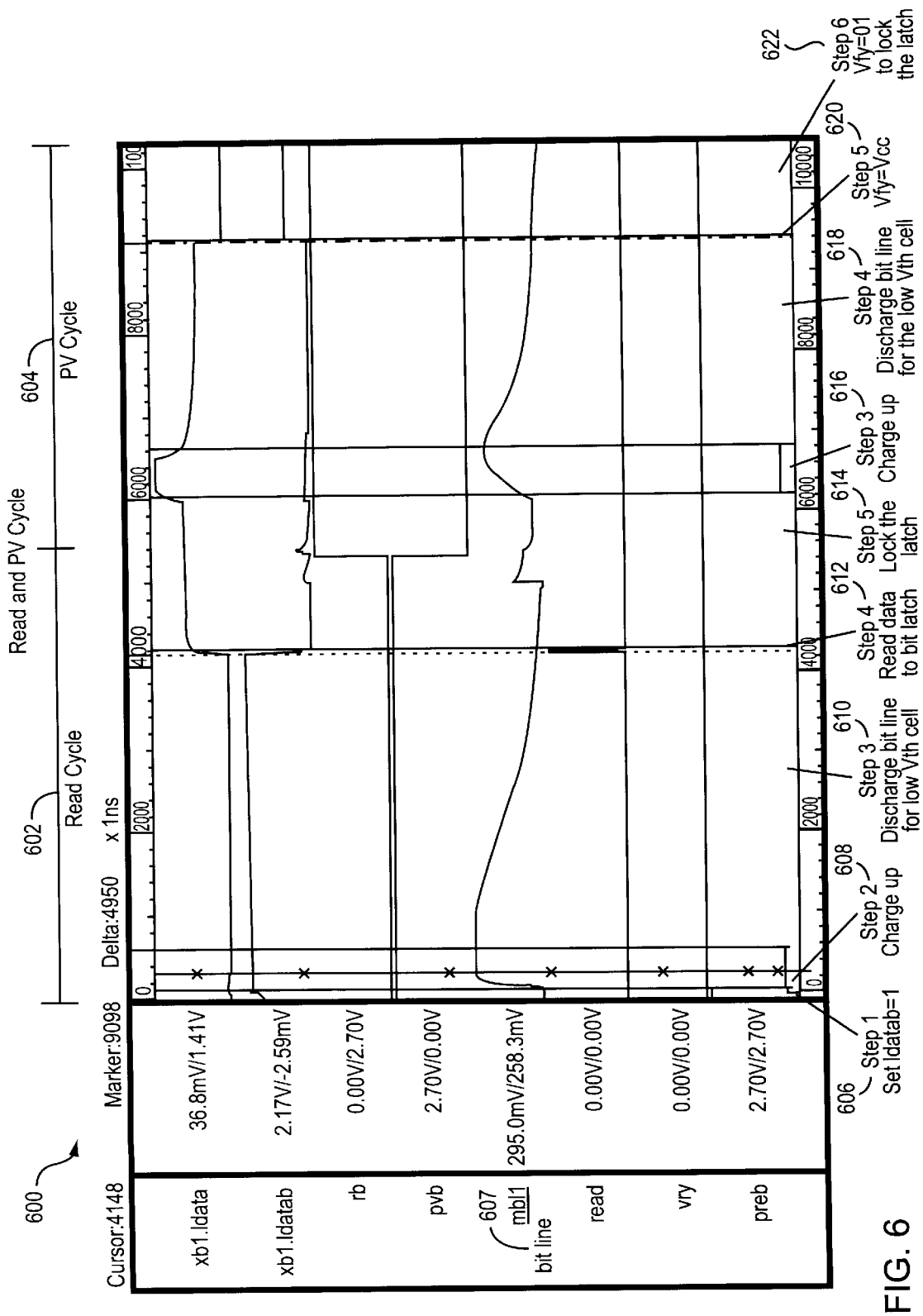
FIG. 6 is a diagram showing a simulation result for various signals during a read and program verify cycle.
Figure 7:
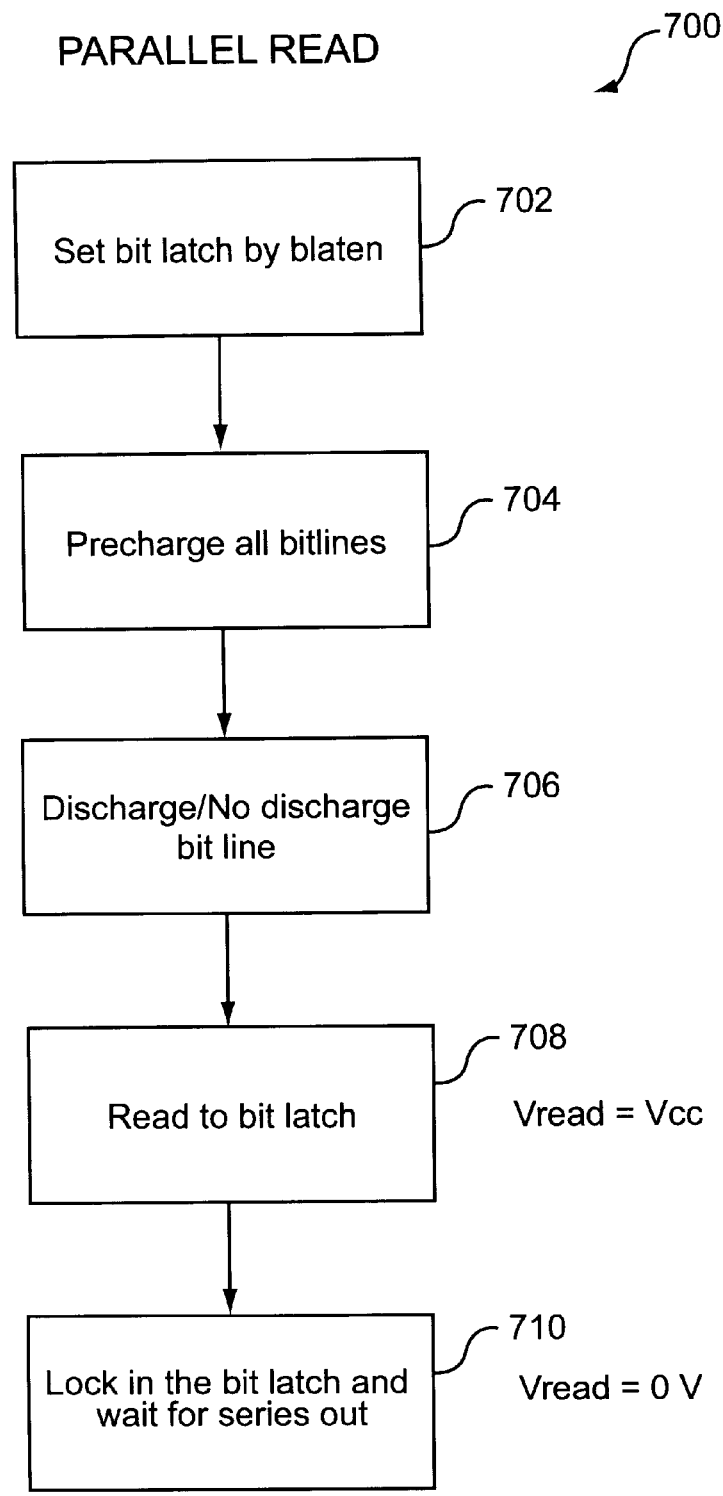
FIG. 7 is flow chart illustrating the parallel read operation executed according to the present invention.

A detailed description of preferred embodiments of the present invention are provided with reference to FIG. 1–8, in which FIGS. 1–5 and 8 illustrate the structure utilized according to the present invention, and FIGS. 6–7 illustrate processes executed that provide parallel read and program verify operations according to the present invention.

Figure 1:
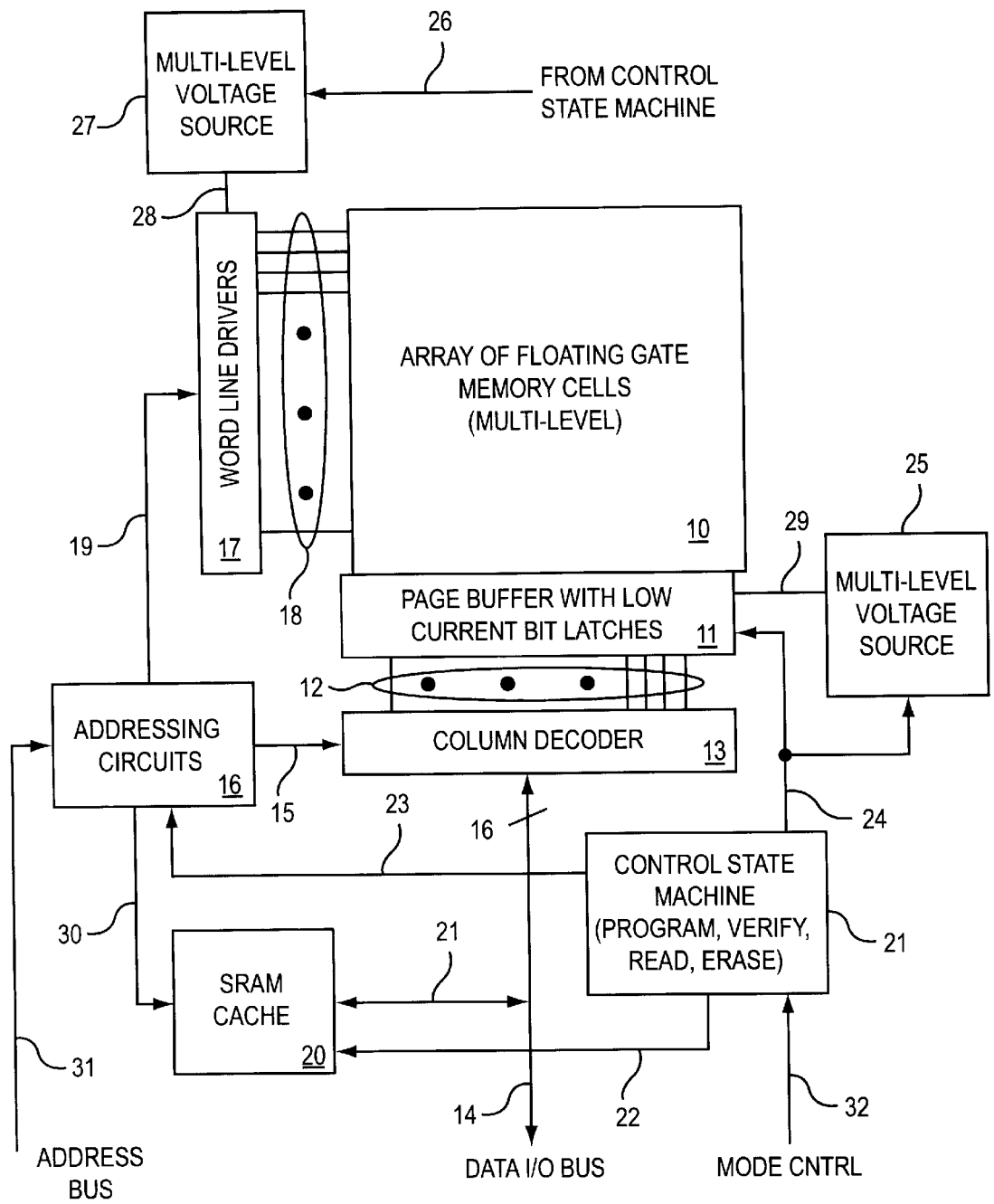
FIG. 1 illustrates a prior art basic block diagram of a floating gate memory integrated circuit, suitable for use with the present invention.

FIG. 1 is a prior art block diagram of an integrated circuit memory including an array 10 of floating gate memory cells. A page buffer 11, with low current (parallel operation) bit latches according to the present invention, is coupled to the array 10 of floating gate memory cells. The low current bit latches in the page buffer 11 are coupled to respective bit lines in the set 12 of bit lines which pass through the array 10 of floating gate memory cells. The set 12 of bit lines is coupled to a column decoder 13 for selecting subsets of the set of bit lines into a data input/output bus 14. In one example, the data input/output bus 14 is 16 bits wide (2 bytes) and the set 12 of bit lines is 1 K (1024) bits (128 bytes) wide. Thus, the column decoder 13 will select 16 bit lines in the set 12 of bit lines onto the data input/output bus 14 at a time in response to addressing signals supplied across line 15 from addressing circuits 16 on the device. Also coupled to the array 10 of floating gate memory cells is a set of wordline drivers 17 which drive a set 18 of wordlines in the array 10 of floating gate memory cells. The wordline drivers select particular rows of cells in response to addressing signals supplied on line 19 from the addressing circuits 16 of the device. Optionally, an SRAM cache 20 is included on the integrated circuit memory. The SRAM cache 20 is connected across line 21 to the data input/output bus 14, and acts as a cache (also called a buffer) for storing and reading data for the array 10 of floating gate memory cells. Thus, data is transferred into the cache 20, and from the cache 200 into the array 10 of the floating gate memory cells, and vice versa in order to provide a flexible input/output interface for the integrated circuit memory.

The integrated circuit memory also include a control state machine 21 which supplies controls signals on line 22 to the SRAM cache 20, controls signals on line 23 to the addressing circuits 16, control signals on line 24 to the page buffer 11 and to a multi-level voltage source 25 connected to the page buffers across line 29. Also, control signals are supplied from the control state machine on line 26 to a multi-level voltage source 27 that is coupled to the wordlines drivers 17 across line 28.

The SRAM cache 20 is responsive to addressing signals on line 30 from the addressing circuits 16, and controls signals on line 22 from the control state machine 21 to act cooperatively with the input/output operations for the array 10 of floating gate memory cells.

Addresses are supplied to the integrated circuit memory on address bus 31. The address bus 31 is coupled to the addressing circuits 16. The addressing circuits generate addressing signals for the wordline drivers 17, the column decoder 13, and the SRAM cache 20.

Also, mode control inputs are supplied on line 32 to the control state machine 21. The mode control inputs on line 32 may be supplied from an external source to the integrated circuit memory, or may be generated by decoding address and data lines, as is known in the art.

According to the present invention, the control state machine 21 executes processes for page mode program, page mode program verify, page mode read, and page mode erase verify operations, in a manner which takes advantage of the parallel operation low current bit latches in the page buffer 11. These process can be understood better after a description of a preferred floating gate memory array and page buffer architecture as provided below with reference to FIGS. 2–5.

Figure 2:
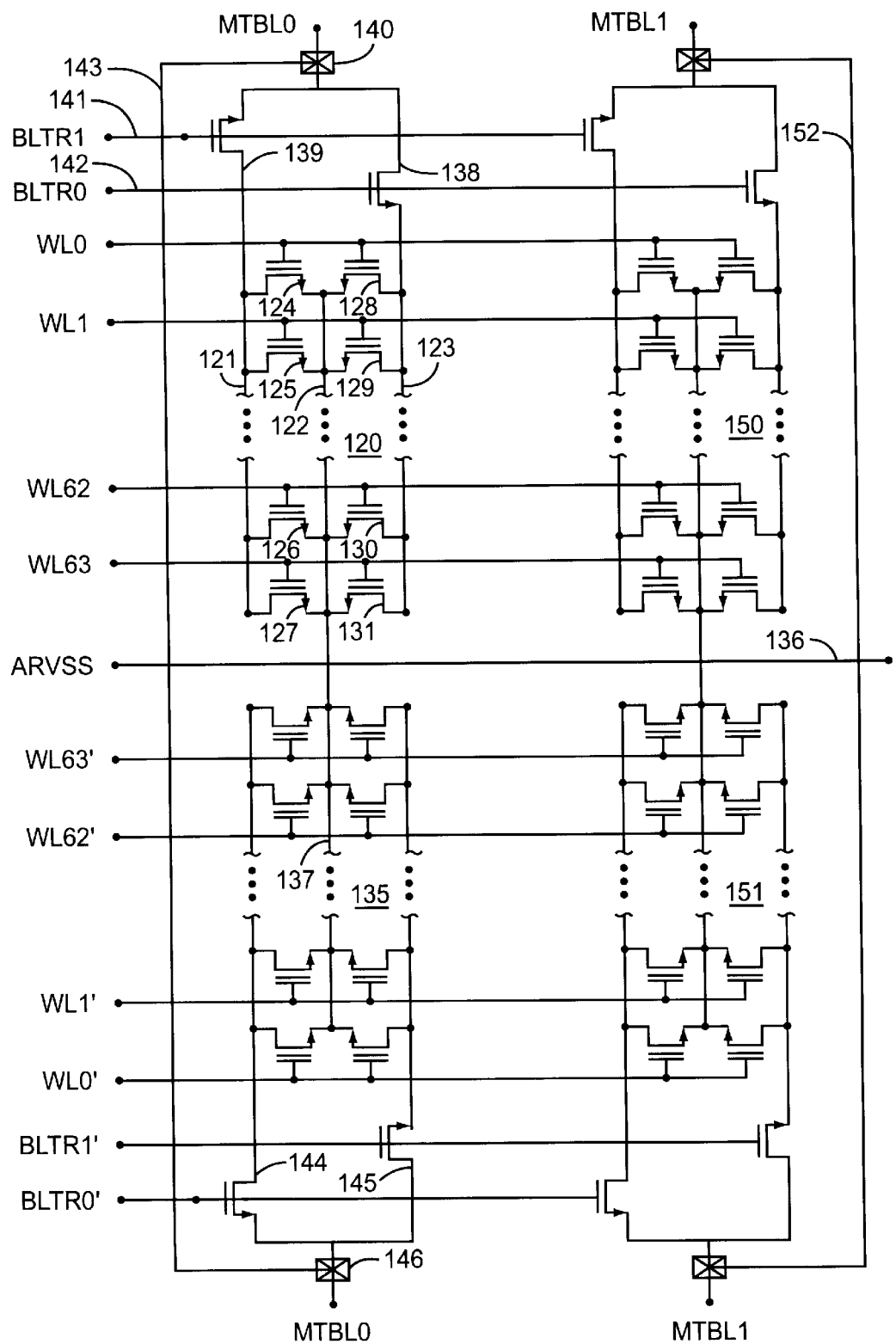
FIG. 2 illustrates a prior art diagram of a floating gate memory array architecture, suitable for use with the present invention.

FIG. 2 illustrates a prior art architecture of the flash EEPROM array which is used by the present invention, in which two columns of flash EEPROM cells share a single metal bit line. FIG. 2 shows four pairs of columns of the array, where each pair of columns includes flash EEPROM cells in a drain-source-drain configuration.

Thus, the first pair 120 of columns includes a first drain diffusion line 121, a source diffusion line 121, a source diffusion line 122, and a second drain diffusion line 123. Word lines WL0 through WL63 each overlay the floating gates of a cell in the second one of the pairs of columns and a cell in the second one of the pairs of columns. The first pair 120 of columns includes one column including cell 124, cell 125, cell 126, and cell 127. Not shown are cells coupled to word lines WL2 through WL61. The second column of the first pair 120 of columns includes cell 128, cell 129, cell 130, and cell 131. Along the same column of the array, a second pair 135 of columns is shown. It has similar architecture to the pair 120 of columns except that it is laid out in a mirror image. Also the second pair 135 of columns is connected to the same metal bit line MTBL0 and the first pair 120.

Thus, a cell in the first one of the pair of columns, such as the cell 125, includes a drain in drain diffusion line 121, and a source in the source diffusion line 122. A floating gate overlays the channel region between the first drain diffusion line 121 and the source diffusion line 122. The word line WL1 overlays the floating gate of the cell 125 to establish a flash EEPROM cell.

The column pair 120 and column pair 135 share an array virtual ground diffusion 136 (ARVSS). Thus, the source diffusion line 122 of column pair 120 is coupled to the ground diffusion 136. Similarly, the source diffusion line 137 of column pair 135 is coupled to the ground diffusion 136.

As mentioned above, each pair 120 of columns of cells shares a single metal line. Thus, a block right select transistor 138 and a block left select transistor 139 are included. The transistor 139 includes a drain in the drain diffusion line 121, a source coupled to the metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 (MTBL0) through metal contact 140. As can be seen, column pair 135 includes left select transistor 144 and right select transistor 145 which are similarly connected to a metal contact 146. Contact 146 is coupled to the same metal line 143 as in contact 140 which is coupled to column pair 120. The metal line can be shared by more than two columns of cells with additional select circuitry.

The architecture shown in FIG. 2 is based upon a drain-source-drain unit forming two columns of cells which are isolated from adjacent drain-source-drain units to prevent leakage current from adjacent columns of cells. The architecture can be extended to units of more than two columns, with appropriate tolerances for leakage current in the sensing circuitry, and other controls on current leakage from unselected cells. Thus, for instance, fourth and fifth diffusion lines could be added within a given isolated region to create a drain-source-drain-source-drain structure which provided four columns of cells.

Column pairs are laid out horizontally and vertically to provide an array of flash EEPROM cells comprising M word lines and 2N columns. The array requires only N metal bit lines each of which is coupled to a pair of columns of flash EEPROM cells through select circuitry, as described above.

Although the figure only shows four column pairs 120, 135, 150, and 151, coupled to two metal bit lines 143 and 152 (MTBL0–MTBL1), the array is repeated horizontally and vertically as required to establish a large scale flash EEPROM memory array. Thus, column pairs 120 and 150 which share a word line are repeated horizontally to provide a segment of the array. Segments are repeated vertically. A group of segments (e.g., eight segments) having respective word lines coupled to a shared word line driver may be considered a sector of the array.

In a preferred system, 1024 metal bit lines are shared by 2048 columns of cells. The 1024 metal bit lines 143 are connected to respective bit latches in the page buffer. The bit latches store a control bit for each metal bit line, used for verify program, verify, read and erase verify operations.

Figure 3:
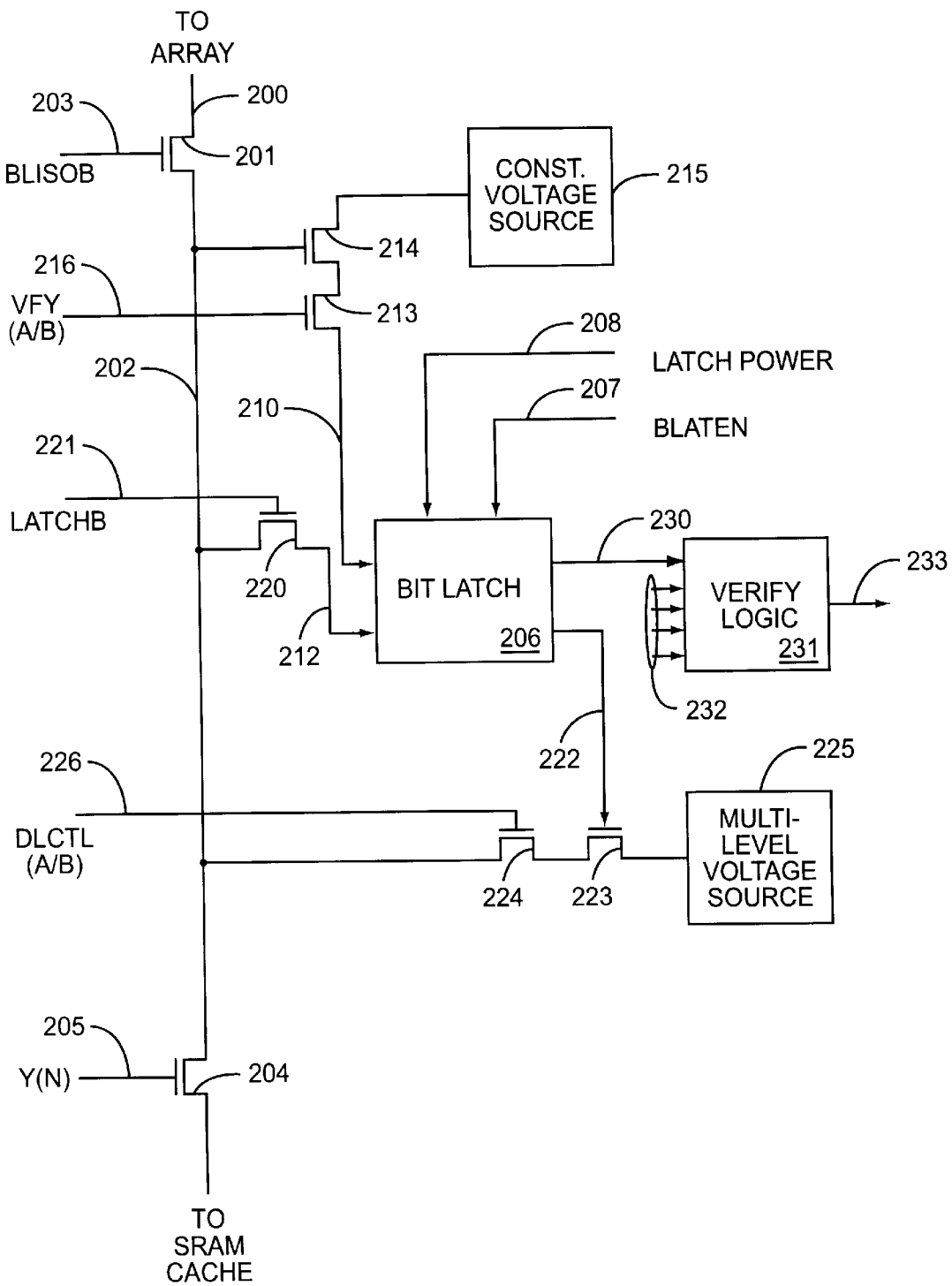
FIG. 3 is a simplified prior art diagram of the bit latch structure, suitable for use with the present invention.

FIG. 3 illustrates a prior art basic structure of a bit line control element, including bit latch 206 in the page buffer 11 for an integrated circuit memory such as that described in FIG. 1. Thus, FIG. 3 includes a bit line 200 that corresponds for example to a metal bit line MTBL0 in the architecture of FIG. 2. The bit line 200 is connected to a pass transistor 201 which is used for the purpose of isolating a bit line segment 202 within the page buffer from the metal bit line 200 of the array. Pass transistor 201 is controlled by a control signal BLISOB on line 203. The bit line segment 202 within the page buffer is coupled to column select circuits represented by pass gate 204. The column select pass gate 204 is controlled by a column select signal Y(N) on line 205, where N goes from 0 to 63 in a set of 1K bit lines using a 16 bit input/output bus. The page buffer consists of a sequence of bit line control elements, associated with respective bit lines. Each bit line control element includes a bit latch 206 coupled with the bit line 200. The bit latch 206 can be implemented with an SRAM type memory element composed of opposing inverters as known in the art. The bit latch 206 has an enable input supplied on line 207 that receives the signal BLATEN. The power used by the bit latch 206 is supplied on line 208. As illustrated in the figure, a signal LATCH POWER is supplied on line 208 which sets the power level of the bit latch 206. Typically this power level will correspond to the VDD voltage in the device. However, it is controlled during various operations as discussed below.

The bit latch 206 has two data inputs. The first data input is received on line 210, and the second data input is received on line 212. The first data input on line 210 is coupled to a pass gate structure including a first pass transistor 213 and a second pass transistor 214 connected in series. On the opposite end of pass transistor 214, a constant voltage source 215 is connected. The gate of pass transistor 214 is couple to the bit line segment 202. The gate of the pass transistor 213 is coupled to a verify control signal VFY (A,B) on line 216. In one embodiment, there are two (or more) verify control signals (A and B) for strobing separate sets of bit latches. In this embodiment, every other bit line receives VFY(A) and the remaining bit lines receive VFY(B).

The second input on line 212 to the bit latch 206 is supplied through pass transistor 220 from bit line segment 202 which is separated from the main bit line 200 by the pass transistor 201. The gate of pass transistor 220 is connected to line 221 which receives the control signal LATCHB.

Bit latch 206 has output 222. The output 222 is connected as a control input to a pass gate composed of pass transistor 223 and pass transistor 224 connected in series between a multi-level voltage source 225, and the bit line segment 202. The output on line 222 of the bit latch 206 is connected to the gate of pass transistor 226 to a data line control signal DLCTL(A,B). In one embodiment, there are two (or more) data line control signals (A and B) separately sensing sets of bit latches in a read mode in coordination with the two VFY (A,B) signals.

The bit latch 206, is configured so that it has a very low impact on the bit line 200, in terms of current consumption, and so that the current requirements of the bit latch do not fight against the current requirements of the bit line 200 during page mode operations. With a low current bit latch according to the present invention, a wide variety of efficient page mode processes are implemented.

Thus, the first input 210 provides a circuit by which the bit latch 206 is loaded with a constant value in response to a change in the voltage level of the bit line 202 to a determinate level low enough to turn on the pass transistor 214. Thus for example if the constant voltage source is VDD, the pass transistor 214 is implemented as a p-channel device. If the voltage level on the bit line 202 is low, when the control signal VFY on line 216 is strobed, then the constant will be loaded from the constant voltage source 215 into the bit latch 206, without consuming current on the bit line 202.

If the constant voltage source 215 is ground, then the pass transistor 214 is implemented with an n-channel device, along with other modifications, and reacts to a high voltage level on the bit line 202 to cause the constant to be loaded into the bit latch 206.

The input 212 to the bit latch 206 is connected to a second circuit which is controlled by the control signal LATCHB on line 221 to load a data value supplied on the bit line segment 202. This path is utilized primarily for loading data through the column select transistor 204 into the bit latch 206, which can be driven by relatively high current data source. This input however is disabled during sensing of the voltage level on the bit line 200.

The output on line 222 of the bit latch is connected to a third circuit which is utilized to transfer a selected voltage level from the multi-level voltage source 225 onto the bit line segment 202 in response to the control bit stored in the bit latch 206 and the enable signal DCLTL on line 226. When the pass gate 201 is enabled, the voltage level supplied by the multi-level voltage source 225 is passed onto the main bit line 200. The enable signal DLCTL on line 226 is used for the purpose of controlling the duration of the connection of the multi-level voltage source 225 to the bit line. The multi-level voltage source can be set to a high programming potential, and the application of the programming potential to the bit line is controlled by the contents of the bit latch 206. Also the multi-level voltage source 225 can be set to VDD, to ground, or to another read potential and the application of the VDD voltage level to the bit line segment 202 controlled by the contents of the bit latch.

According to this prior art structure, the bit latch 206 has a second output on line 230, which is connected to logic 231 determine whether all the bit latches 206 in the page buffer store the constant value (for program verify) or to determine whether any bit latch 206 in the page buffer stores the constant value (for erase verify). The logic 231 includes one input coupled to each bit latch 206 in the page buffer, as represented by the lines 232. If all of the bit latches 206 store a low constant (at mode 230), then the output of the logic function will be high on line 233 indicating that all bit latches have been reset to the low constant value. If any one of the bit latches has not been reset to the constant value, then the output of the logic function on line 233 will be low, indicating that not all have been reset to the constant value. This logic is useful in program or erase verify situations.

FIG. 4 provides a detailed circuit diagram of a bit line control element including bit latch 206 as shown in FIG. 3. Bit line 300 is connected to the source of a triple well NMOS transistor 302. The transistor 302 is formed by creating a n-type well in the substrate, then creating a p-type well within the n-type well and forming an NMOS transistor therein. The p-well in the structure is biased by a bias-potential PWI on line 303. The gate of the transistor 302 is controlled by the control signal BLISOB on line 301. A bit line segment 304 is connected to the source of the transistor 302. The bit line segment 304 is coupled to the data line output (DLOUT) terminal 306.

A bit latch storage element is a basic SRAM type with an enable circuit. The storage element includes an inverter composed of an n-channel transistor 311 in series with an n-channel transistor 312. Each transistor has a width of about 2 microns and a length of about 0.65 microns. The control signal BLATEN 315 is connected to the gate of transistor 311. The drain of transistor 312 is connected to node 314 of the memory element, which is the LDATAB signal 325. The gate of transistor 312 is coupled to the LDATA signal 327. The signals LDATA 325 and LDATAB 327, as configured, provide for separate data entry points into the bit latch circuit to facilitate parallel read and parallel program verify operations.

A LATCHPWR control signal 314 is coupled to the source nodes of triple well PMOS transistors with built-in inverters 316, 318, and 320. Bias potential line 317 on transistor 316 is coupled to LATCHPWR signal 314. The gate of transistor 316 is coupled to signal LDATA 327 via branch line 329. The source of transistor 316 is coupled (in series) with a second triple well transistor 322 (also shown as P1). The bias potential line 324 is coupled to the drain node of transistor 322. A READ signal 328 is coupled to gate of transistor 322. The drain of transistor 322 is coupled to the drain of transistor 312, and both are commonly connected to LDATAB signal 325.

Transistor 318 is coupled to the LATCHPWR signal 314 at its source, BLATEN 315 at its gate and LDATAB 325 at its drain. The bias potential line 319 is coupled to the source of transistor 318.

Transistor 320 is further coupled in series with a triple well transistor 330, with the drain of transistor 320 coupled to the source of transistor 330. The bias potential lines of transistors 320 and 330 are coupled to the respective source nodes of the transistors. The drain of transistor 330 is further coupled to the drain of an n-channel transistor 332, with its source coupled to ground. The gate of transistor 320 is coupled to the gate of transistor 332. The gate of transistor 330 is coupled to a verify (VFY) control signal 334.

A data line power (DLPWR) input signal 340 is coupled to the drain node of an n-channel transistor 342 (also shown as N4). Such transistors would include native n-channel type devices. The gate of transistor 342 is further coupled to the gate of an n-channel transistor 350. Transistor 350 is coupled to the ABLRES1 (all bit latches reset) line 352 at its drain and is grounded at its source node. The source of transistor 342 is coupled to DLOUT signal 306. Via the N4 device, the data line will be precharged when LDATA=1 (e.g. the cell will be programmed), or alternatively the other bit line voltage will be zero.

Circuitry is further provided to avoid data conflicts during the read/program verify cycles. Transistor 360 (also shown as N1) is coupled to LDATAB at its source node and to the dataline 304 at its drain node. A READ control signal input 362 is coupled to the gate. Further shown is a triple well transistor 364 with its drain coupled to the drain node of an n-channel transistor 366, the source of 366 further coupled to ground. The gates of transistors 364 and 366 are also commonly connected. Transistor 368 (also shown as N2) is shown connected in series (drain to source) with transistor 370 (also shown as N3), which has its drain connected to ground. The source of transistor 368 is coupled to LDATA signal line 327. The gate of transistor 368 is coupled to a verify (VFY) control signal 372. The gate of transistor 370 is coupled to common drain node of transistors 364 and 366. The source of triple well transistor 364 is coupled to the signal PINVPWR 374, and the bias potential line is coupled to the source of transistor 364.

While any of a variety of device measurements might be used, a list of example dimensions would include: for transistors 316, 318, 322—width 2 microns, length 0.75 microns; for transistors 320, 330—width 8 microns, length 0.75 microns; for transistors 311, 312—width 2 microns, length 0.65 microns; for transistor 332—width 2 microns, length 1 micron; for transistor 342—width 7 microns, length 1.3 microns; for transistors 360, 368, 370—width 3 microns; and for transistors 364, 366—width 2 microns. Other lengths and/or widths would be chosen to facilitate appropriate formation of the device.

Referring now to FIG. 5, another circuit variation is provided of a bit line control element including bit latch 206 as shown in FIG. 3. Bit line 400 is connected to the source of a triple well NMOS transistor 402. The transistor 402 is formed by creating a n-type well in the substrate, then creating a p-type well within the n-type well and forming an NMOS transistor therein. The p-well in the structure is biased by a bias-potential PWI on line 403. The gate of the transistor 402 is controlled by the control signal BLISOB on line 401. A bit line segment 404 is connected to the source of the transistor 402. The bit line segment 404 (DLIN) is coupled to the data line output (DLOUT) terminal 406 through resistor 405.

A bit latch storage element is a basic SRAM type with an enable circuit. The storage element includes an inverter composed of an n-channel transistor 411 in series with an n-channel transistor 412. Each transistor has a width of about 2 microns and a length of about 0.65 microns. The control signal BLATEN 415 is connected to the gate of transistor 411. The drain of transistor 412 is connected to node 414 of the memory element, which is the LDATAB signal 425. The gate of transistor 412 is coupled to the LDATA signal 427.

A LATCHPWR control signal 414 is coupled to the source nodes of triple well PMOS transistors with built-in invertors 416, 418, and 420. Bias potential line 417 on transistor 416 is coupled to LATCHPWR signal 414. The gate of transistor 416 is coupled to signal LDATA 427 via branch line 429. The source of transistor 416 is coupled (in series) with a second triple well transistor 422 (also shown as P1). The bias potential line 424 is coupled to the drain node of transistor 422. A READ signal 428 is coupled to gate of transistor 422. The drain of transistor 422 is coupled to the drain of transistor 412, and both are commonly connected to LDATAB signal 425.

Transistor 418 is coupled to the LATCHPWR signal 414 at its source, BLATEN 415 at its gate and LDATAB 425 at its drain. The bias potential line 419 is coupled to the source of transistor 418.

Transistor 420 is further coupled in series with a triple well transistor 430, with the drain of transistor 420 coupled to the source of transistor 430. The bias potential lines of transistors 420 and 430 are coupled to the respective source nodes of the transistors. The drain of transistor 430 is further coupled to the drain of an n-channel transistor 432, with its source coupled to ground. The gate of transistor 420 is coupled to the gate of transistor 432. The gate of transistor 430 is coupled to a verify (VFY) control signal 434.

A data line power (DLPWR) input signal 440 is coupled to the drain node of an n-channel transistor 442 (also shown as N4). Such transistors would include native n-channel type devices. The gate of transistor 442 is further coupled to the gate of an n-channel transistor 450. Transistor 450 is coupled to the ABLRES1 (all bit latches reset) line 452 at its drain and is grounded at its source node. The source of transistor 442 is coupled to DLOUT signal 406. Via the N4 device, the data line will be precharged when LDATA=1 (e.g. the cell will be programmed), or alternatively the other bit line voltage will be zero.

Circuitry is further provided to avoid data conflicts during the read/program verify cycles. For example, transistor 460 (also shown as N1) is coupled to LDATAB at its source node and to the dataline 404 at its drain node through VREAD capacitor 464. This present method will be active only for LDATA=1 and verified data=0. In that time period, the program cycle will be done. As a result, a circuit N7 in the form of a MOS diode 470 is used to isolate the condition of LDATA=0 (no need for program) and verified data=1 (high Vth). A verify control signal (VRY) 468 is coupled to the base of transistor 466. A dataline control signal (DLCTL) 472 is also coupled to the base of transistor 474. Transistor 474 has a capacitor 476 between its source and signal DLOUT 406, and its drain is coupled to the source of transistor 442.

The aforementioned bit latch circuits allow for writing the same data on the data line during the following example operations: 1) series write (e.g. load 0) via "READ" 362 being set to "on" and LDATAB=0; 2) parallel programming cell to the low Vth cell; and 3) parallel read (e.g. read 0) via "READ" 362 being "on" and LDATAB=0. "Series out" is achieved via discharging DLPWR which causes LDATA=1. The N4 circuitry provides for bit-by-bit precharging in the beginning of operations to thereby save precharge power. To avoid data conflicts during the parallel read/program verify cycles, the following combinations of circuitry (for example) might be used: 1) N1+P1—the separate READ and "READ" signals 328 and 362 provide for additional control over LDATA and LDATAB; 2) N2+N3—the VRY signal with feedback from the data line signal; and 3) N7 circuit—the circuit will only be active for LDATA=1, and VFY (verified data)=0 (e.g. low Vth). During that time period, the program cycle will be completed. Hence, a MOS diode is used to isolate the condition of LDATA=0 (i.e. no need to program) and verified data=1 (e.g. high Vth).

While any of a variety of device measurements might be used, a list of example dimensions would include: for transistors 416, 422—width 8 microns, length 0.75 microns; for transistors 420, 430—width 6 microns, length 0.75 microns; for transistors 411, 412—width 0.5 microns, length 3 microns; for transistor 432—width 1.5 microns, length 0.65 microns; for transistors 442, 474—width 7 microns, length 1.3 microns; for transistors 460, 466—width 3 microns, length 0.75 microns; for transistor 470—width 3 microns, length 1.3 microns; for transistor 478—width 14 microns, length 1.3 microns; and for transistor 450—width 3 microns, length 0.65 microns. Other lengths and/or widths would be chosen to facilitate appropriate formation of the device.

Figure 8:
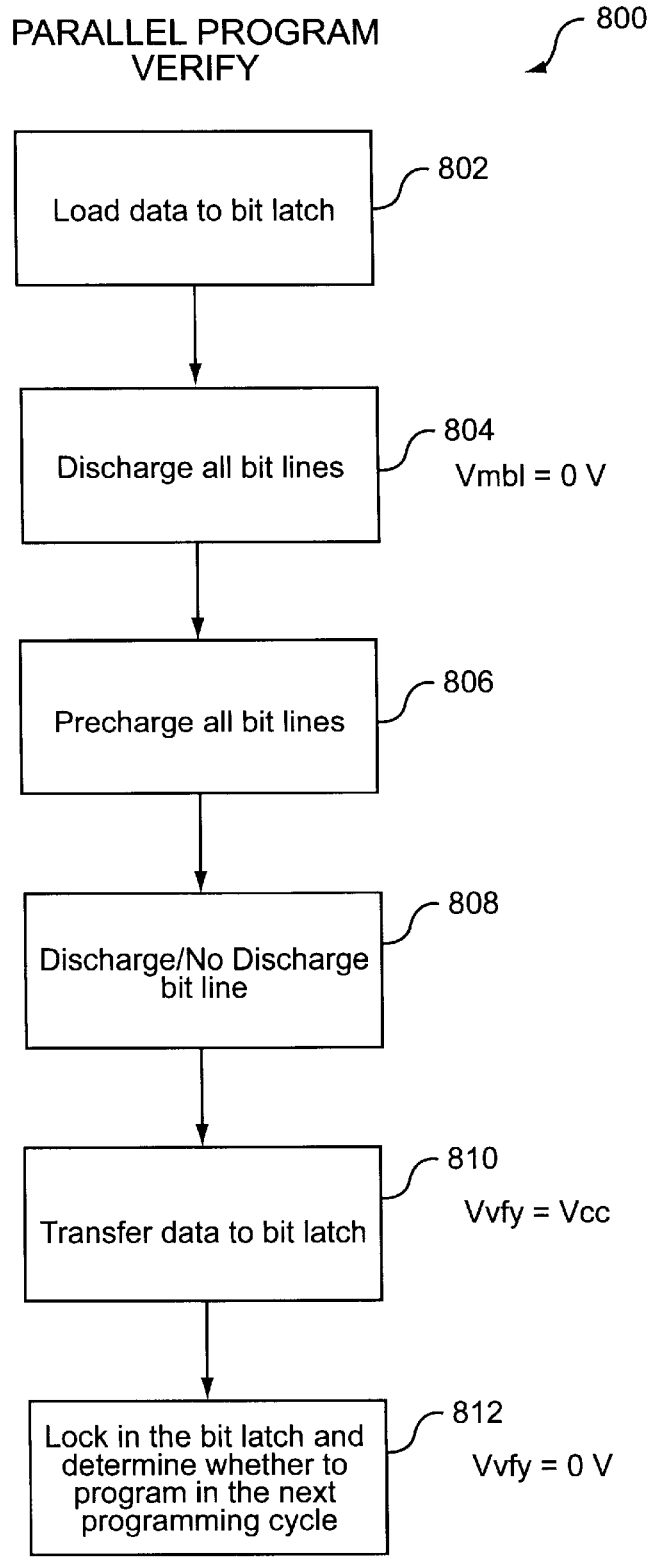
FIG. 8 is a flow chart illustrating the parallel program and verify operation according to the present invention.

Referring now to FIG. 6, a diagram 600 is shown of simulation results for certain demonstrative signals within the circuit. The timing of the chart is divided into a read cycle portion 602 and a program verify cycle portion 604. FIG. 7 illustrates, in flowchart form 700, certain representative steps associated with a parallel read operation. FIG. 8 illustrates, in flowchart form 800, certain representative steps associated with a parallel program verify operation. The description or process is not meant to be limited to these example steps.

Referring now to FIGS. 6 and 7, the parallel read cycle is described. In FIG. 6, the signal levels are shown for steps 606 through 614. In FIG. 7, the corresponding flow chart steps are shown. In a first step 606, the signal LDATAB is set to "1" (or a sufficiently high voltage, e.g. Vcc, to be construed by the receiving device as "on"). This is achieved by setting the bit latch enable signal (BLATEN) to zero. In FIG. 7, this step 702 is shown as setting the bit latch by BLATEN. A second step 608 provides a charge up period for the bit line signal 607. Typically, all the bit lines are charged up to 2 volts. FIG. 7 shows this step 704 as precharging all the bit lines. A third step 610 involves discharging the bit line (to zero) if the cell has a low voltage threshold (or "Vth"). For cells with a high Vth, then no discharge will occur. FIG. 7 shows this step as discharging, or not discharging, the bit line 706. In a fourth step 612, the read data is applied to the bit latch. The read signal is set to Vcc. If the bit line=0, then the signal bitlatch.ldata will be set to 1. If the bit line=1, then the signal bitlatch.ldata will remain at zero. This serves to latch the whole page of data to the bit latch. FIG. 7 shows this step 708 as reading the bit latch, with Vread=Vcc. In a fifth step 614, the latch is locked by setting the read signal to zero. FIG. 7 shows this step as locking the bit latch, with Vread=0 volts, and waiting for the series out, with LDATA=1, and a discharge via the input DLPWR.

The program verify cycle is further described in steps 616 through 622 of FIG. 6, and the corresponding flowchart steps of FIG. 8. In FIG. 6, a first step (similar to 606), occurs wherein the program (PGM) data is loaded to the bit latch. The signal bitlatch.ldata is set to 1 for a cell to be programmed. The signal bitlatch.ldata is set to 0 for a cell that is not to be programmed. FIG. 8 shows this step 802 as loading the data to the bit latch. In a second step (similar to 610 in FIG. 6), all the bit lines are discharged. FIG. 8 shows this as step 804, with signal Vmb1=0 volts. In step 616 of FIG. 6, a charge up period is shown for the bit line 607 if bitlatch.ldata=1, and no charge up if the bitlatch.ldata=0. This is achieved by setting the dataline control signal (DLCTL)=Vcc. This bit-by-bit precharge is used, among other things, to save precharge power. FIG. 8 shows this as step 806. In step 618 of FIG. 6, the bit line is discharged for the low Vth cell, and no discharge is performed if the cell has a high Vth. FIG. 8 shows this as step 808. In step 620, the verify signal (Vfy) is set to Vcc. If the bit line=0, then the signal bitlatch.ldata will be set to zero. If the bit line=1, then bitlatch.ldata will remain at it's original value. FIG. 8 shows this step as 810, wherein the data is transferred to the bit latch, via signal Vvfy=Vcc. In step 622, the Vfy signal is returned to 0 volts to lock the latch. FIG. 8 shows this step 812 as locking in the bit latch and determining whether to program in the next programming cycle, with signal Vvfy=0 volts.

Figure 9:
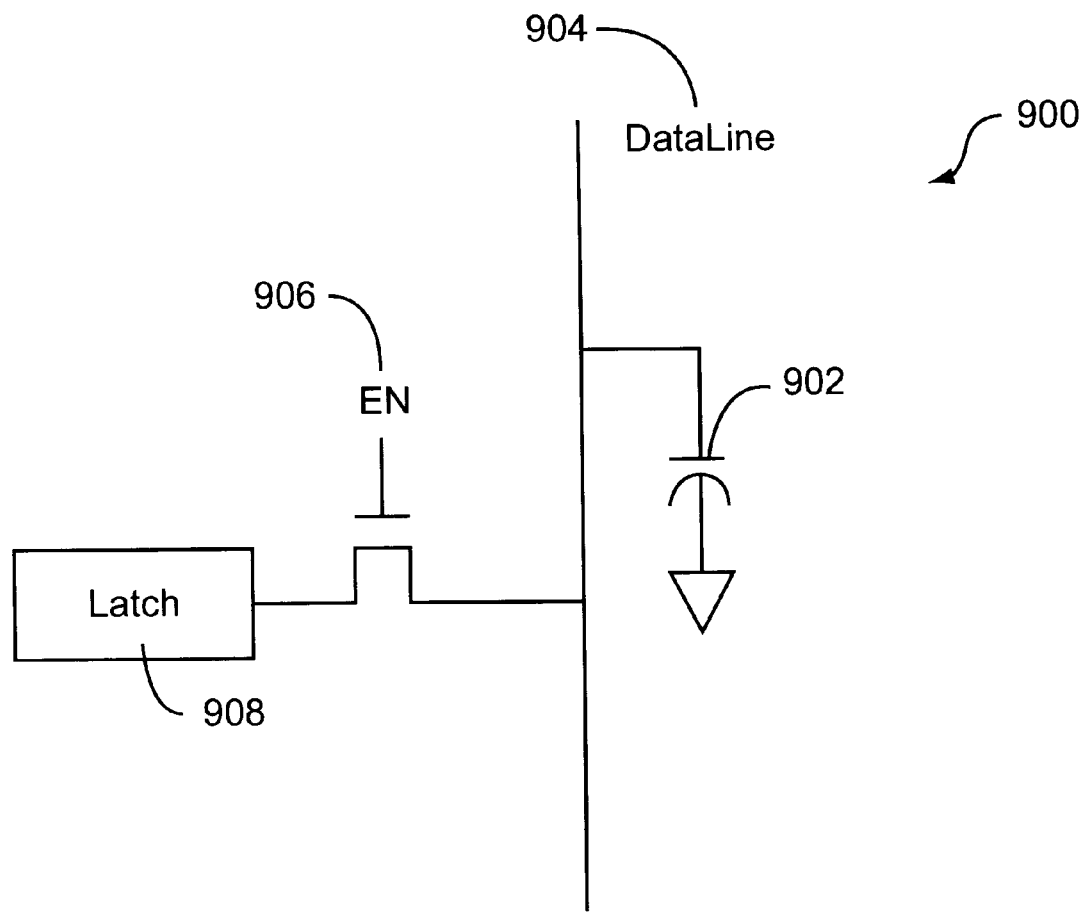
FIG. 9 is a diagram showing the use of the large capacitance of the data line to change the latch data directly.

Referring now to FIG. 9, a further embodiment is shown whereby the large capacitance of the data line is used to change the latch data directly. In general, the capacitance 902 of the data line 904 is very large. If more time is spent to discharge the data line via the low Vth cell, and the enable (EN) signal 906 goes high during that time, then the latch data 908 will be restored. One possible disadvantage of this arrangement includes the data line data being used to force the data of the latch to change. As a result, this arrangement might consume more power. However, an advantage of this arrangement is that no additional devices or circuitry are needed to avoid a data conflict (like, for instance, the N7 circuitry, or MOS diode, shown in FIG. 5).

While this invention has been described in terms of several embodiments, there are alterations, permutations, and equivalents which fall within the scope of this invention. It should be noted that there are many alternative ways of implementing the methods and system of the present invention. It is therefore intended that the following appended claims be interpreted as including all such alternations, permutations, and equivalents as they fall with the true spirit and scope of the present invention.

What is claimed:

1. For an array of floating gate memory cells including bit lines coupled with corresponding columns of cells in the array; word lines coupled with corresponding rows of cells in the array, and bit latches coupled to the respective bit lines, a method providing for parallel read on the dataline, the method comprising:

setting the bit latches via application of an enabling signal;

charging up all of the bit lines;

selectively discharging and not discharging certain bit lines;

reading the bit latch; and locking in the bit latch and waiting for a series output.

2. The method of claim 1, wherein the charging step includes bit-by-bit precharging.

3. The method of claim 1, wherein the step of selectively discharging and not discharging includes discharging the bit line to zero if the corresponding cell has a low voltage threshold, and not discharging the bit line if the corresponding cell has a high voltage threshold.

4. The method of claim 1, wherein the step of reading the bit latch includes latching the whole page of data to the bit latch.

5. The method of claim 4, wherein if the bit line is low, then the bit latch will be set to high, and if the bit line is high, then the bit latch will remain low.

6. The method of claim 5, wherein the bit line settings further depend on how the bit latch data is defined as high or low.

* * * * *